US012593399B2

(12) United States Patent
Nien et al.

(10) Patent No.: US 12,593,399 B2
(45) Date of Patent: Mar. 31, 2026

(54) ELECTRONIC DEVICE AND MANUFACTURING METHOD THEREOF

(71) Applicant: CARUX TECHNOLOGY PTE. LTD., Singapore (SG)

(72) Inventors: Chueh-Yuan Nien, Tainan (TW); Ching-I Lo, Tainan (TW); Li-Wei Sung, Tainan (TW); Yu-Ling Hung, Tainan (TW)

(73) Assignee: CARUX TECHNOLOGY PTE. LTD., Singapore (SG)

( * ) Notice: Subject to any disclaimer, the term of this patent is extended or adjusted under 35 U.S.C. 154(b) by 307 days.

(21) Appl. No.: 18/536,250

(22) Filed: Dec. 12, 2023

(65) Prior Publication Data

US 2024/0237198 A1     Jul. 11, 2024

(30) Foreign Application Priority Data

Jan. 5, 2023     (CN) .......................... 202310015396.6

(51) Int. Cl.
*H05K 1/02*          (2006.01)
*H05K 3/00*          (2006.01)

(52) U.S. Cl.
CPC ........... *H05K 1/028* (2013.01); *H05K 3/0044* (2013.01); *H05K 2203/0195* (2013.01); *H05K 2203/0522* (2013.01)

(58) Field of Classification Search
CPC ........... H05K 1/028; H05K 2203/0522; H05K 2201/10128
See application file for complete search history.

(56) References Cited

U.S. PATENT DOCUMENTS

| | | | | |
|---|---|---|---|---|
| 10,921,508 | B2 * | 2/2021 | D'Anna | G02B 6/0088 |
| 2015/0109742 | A1 * | 4/2015 | Tsai | G02F 1/133308 |
| | | | | 361/748 |
| 2015/0256658 | A1 * | 9/2015 | Shin | G06F 1/1637 |
| | | | | 455/566 |
| 2016/0174399 | A1 * | 6/2016 | Ichikawa | A61B 5/681 |
| | | | | 361/752 |
| 2017/0013704 | A1 * | 1/2017 | Kim | H05K 7/02 |
| 2021/0341782 | A1 * | 11/2021 | Jhou | B32B 7/14 |
| 2022/0365394 | A1 * | 11/2022 | Chen | G02F 1/133612 |
| 2023/0251689 | A1 * | 8/2023 | Lo | G06F 1/1601 |
| | | | | 361/807 |

FOREIGN PATENT DOCUMENTS

CN          110494286          11/2019

* cited by examiner

*Primary Examiner* — Sherman Ng
(74) *Attorney, Agent, or Firm* — JCIPRNET

(57) ABSTRACT

An electronic device and a method of manufacturing the electronic device are provided. The method of manufacturing the electronic device includes the following steps: providing a circuit board; performing a first pre-bending step on the circuit board so that the circuit board is bent to have a first radius of curvature; providing a back frame having a second radius of curvature; attaching the circuit board having the first radius of curvature to the back frame through an adhesive. A difference between the first radius of curvature and the second radius of curvature is within 10%.

20 Claims, 14 Drawing Sheets

150a(150)

SB

SA

153

154

ELECTRONIC DEVICE AND MANUFACTURING METHOD THEREOF

CROSS-REFERENCE TO RELATED APPLICATION

This application claims the priority benefit of China application serial no. 202310015396.6, filed on Jan. 5, 2023. The entirety of the above-mentioned patent application is hereby incorporated by reference herein and made a part of this specification.

BACKGROUND

Technical Field

The disclosure relates to an electronic device and a manufacturing method thereof, in particular to an electronic device capable of improving yield and a manufacturing method thereof.

Description of Related Art

With the rapid development of electronic devices, the electronic devices tend to have curved surfaces or other appearance designs. Therefore, higher requirements are placed on the manufacturing yield of the electronic devices or the reliability or quality of the electronic devices.

SUMMARY

According to an embodiment of the disclosure, a method of manufacturing the electronic device includes the following steps: providing a circuit board; performing a first pre-bending step on the circuit board so that the circuit board is bent to have a first radius of curvature; providing a back frame having a second radius of curvature; and attaching the circuit board having the first radius of curvature to the back frame through an adhesive. A difference between the first radius of curvature and the second radius of curvature is within 10%.

According to an embodiment of the disclosure, an electronic device includes a back frame, a circuit board and a patterned adhesive. The back frame has a first curved surface. The circuit board is disposed on the back frame and has a second curved surface. The patterned adhesive is disposed between the back frame and the circuit board. The patterned adhesive has an adhesive area attached to the circuit board, a surface of the circuit board adjacent to the patterned adhesive has a surface area, and the adhesive area and the surface area meet the following relationship: 30%≤adhesive area/surface area≤99%.

According to an embodiment of the disclosure, a method of manufacturing an electronic device includes the following steps: providing a protective substrate; performing a second pre-bending step on the protective substrate so that the protective substrate is bent to have a fourth radius of curvature; providing a back frame having a second radius of curvature; and assembling the protective substrate having the fourth radius of curvature to the back frame. The second radius of curvature is smaller than the fourth radius of curvature, and a difference between the fourth radius of curvature and the second radius of curvature is greater than 0 mm and less than 8000 mm.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
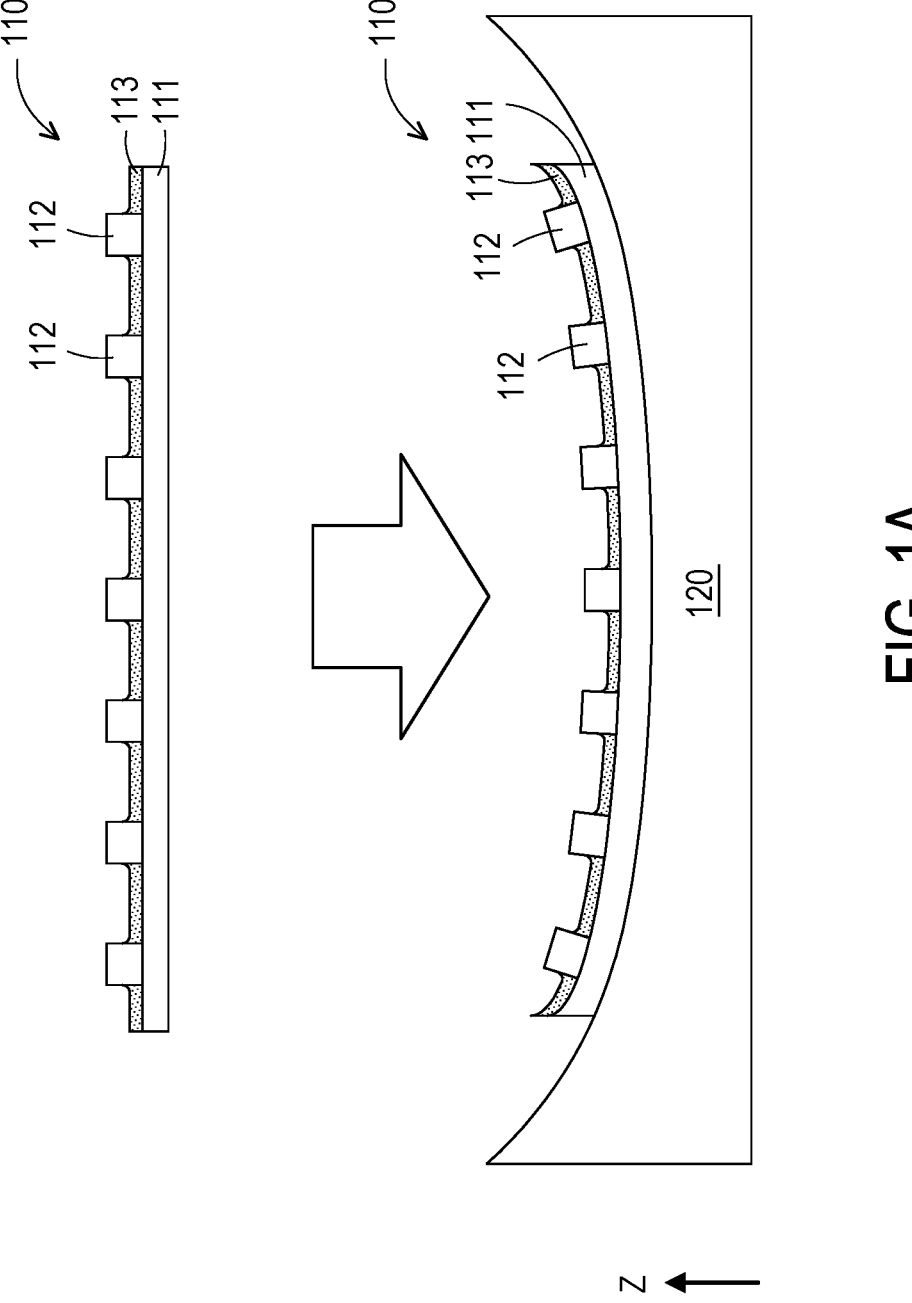
FIG. 1A to FIG. 1D are schematic cross-sectional views of a method for manufacturing an electronic device according to an embodiment of the disclosure.

The following disclosure provides many different embodiments or examples for implementing different elements in the provided display device. Specific examples of each component and its configuration are described below to simplify the embodiments of the disclosure. Of course, these are just examples, not intended to limit the disclosure. For example, if the description mentions that a first element is formed on a second element, it may include an embodiment in which the first and second elements are in direct contact, and may also include an additional element formed between the first and second elements, so that they are not in direct contact with the example. In addition, the embodiments of the disclosure may repeat element symbols and/or characters in different examples. This repetition is for brevity and clarity and is not intended to represent a relationship between the different embodiments and/or aspects discussed.

The terms of direction mentioned in this document, for example: "upper", "lower", "front", "rear", "left", "right", etc., are only directions with reference to the drawings. Therefore, the direction terms are used to illustrate, not to limit the disclosure.

In some embodiments of the disclosure, unless specifically defined otherwise, the terms related to joining and connection, such as "connected" and "interconnected", may refer to two structures being in direct contact, or may refer to two structures not being in direct contact and other structures are provided between the two structures. Moreover, the terms about joining and connecting may include a case where two structures are movable or two structures are fixed. In addition, the term "coupled" includes any direct and indirect electrical connection means.

The ordinal numbers used in the specification and claims, such as "first", "second", etc., are used to modify elements, which do not imply and represent that the (or these) elements have any previous ordinal numbers, nor do they represent the order of one element with another element, or the order in the method of manufacture. The use of these ordinal numbers is only used to clearly distinguish an element with a certain designation from another element with the same designation. The claims and the specification may not use the same term, accordingly, a first constituent element in the specification may be a second constituent element in the claims. The terms "approximately", "equal to", "equal" or "same", "substantially" or "roughly" are generally interpreted as being within 20% of a given value or range, or interpreted as being within 10%, 5%, 3%, 2%, 1% or 0.5% of the given value or range.

Furthermore, any two values or directions used for comparison may have certain errors. If a first value is equal to a second value, it implies that there may be an error of about 10% between the first value and the second value; if a first direction is perpendicular or "approximately" perpendicular to a second direction, then an angle between the first direction and the second direction may be between 80 degrees and 100 degrees; if a first direction is parallel or "substantially" parallel to a second direction, then an angle between the first direction and the second direction may be between 0 degrees and 10 degrees.

Unless otherwise defined, all terms (including technical and scientific terms) used herein have the same meaning as commonly understood by one of ordinary skilled in the disclosure. It may be understood that these terms, such as those defined in commonly used dictionaries, should be interpreted as having meanings consistent with the background or context of the related technology and the disclosure, and should not be interpreted in an idealized or overly formal manner, unless otherwise specified in the disclosed embodiments.

Some variations of the embodiment are described below. In the different drawings and described embodiments, similar reference numerals are used to designate similar elements. It may be understood that additional operations may be provided before, during and after the method, and some described operations may be replaced or deleted for other embodiments of the method.

It should be understood that, according to the embodiments of the disclosure, measurement of depth, thickness, width or height of each element, or measurement of distance or interval between elements may be done by applying an optical microscope (OM), a smayning electron microscope (SEM), an alpha step (α-step) profilometer, an ellipsometer, or any other appropriate measurement method. According to some embodiments, the SEM may be applied to obtain a cross-sectional image of a to-be-measured element, and the depth, the thickness, the width, or the height of each element or the distance or the interval between the elements may be measured.

In the disclosure, the electronic device may include a display device, a backlight device, an antenna device, a sensing device, or a tiled device, but is not limited thereto. The electronic device may include a bendable or flexible electronic device. The display device may include a non-self-luminous display device or a self-luminous display device. The antenna device may include a liquid crystal antenna device or a non-liquid crystal antenna device, and the sensing device may include but may not be limited to a sensing device for sensing capacitance, light, heat, or ultrasonic waves. The electronic elements may include passive elements and active elements, such as capacitors, resistors, inductors, diodes, and transistors. The diodes may include light emitting diodes or photodiodes. The light emitting diodes may include, for instance, organic light emitting diodes (OLED), sub-millimeter light emitting diodes (mini LED), micro light emitting diodes (micro LED), or quantum dot light emitting diodes (quantum dot LED), but is not limited thereto. The tiled device may include but may not be limited to, for instance, a display tiled device or an antenna tiled device. It should be noted that the electronic device may be any arrangement and combination of the foregoing, but is not limited thereto. The display device is used as an electronic device or a splicing device to illustrate the disclosure hereinafter, but the disclosure is not limited thereto.

In addition, the appearance of the electronic device may be in a rectangular shape, a circular shape, a polygonal shape, a shape with curved edges, or other suitable shapes. The electronic device may have peripheral systems, such as a processing system, a driving system, a control system, a light source system, a rack system, and the like, so as to support a display device or a tiled device.

It should be noted that the electronic device may be any arrangement and combination of the foregoing, but is not limited thereto. It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Unless otherwise defined, all terms (including technical and scientific terms) used herein have the same meaning as commonly understood by one of ordinary skilled in the art in the disclosure. It may be understood that these terms, such as those defined in commonly used dictionaries, should be interpreted as having meanings consistent with the background or context of the related technology and the disclosure, and should not be interpreted in an idealized or overly formal manner, unless otherwise specified in the disclosed embodiments. It should be noted that the electronic device may be any arrangement and combination of the foregoing, but is not limited thereto. It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Reference will now be made in detail to the exemplary embodiments of the disclosure, and examples of the exemplary embodiments are illustrated in the accompanying drawings. Whenever possible, the same reference numbers are used in the drawings and descriptions to indicate the same or similar parts.

Figure 2B:
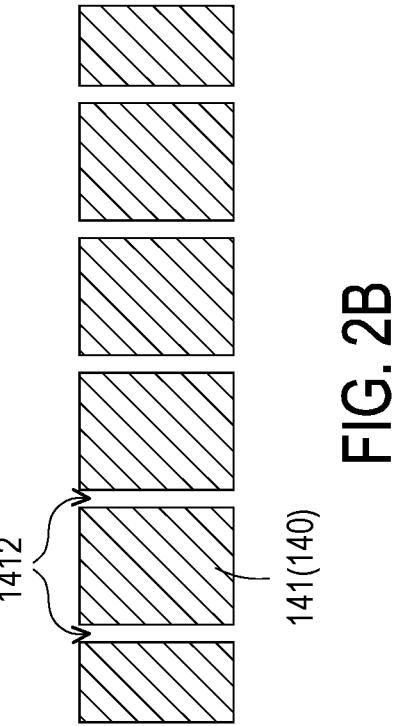
FIG. 2A to FIG. 2B are partial cross-sectional schematic views of the back frame of various embodiments of the disclosure.
Figure 2A:
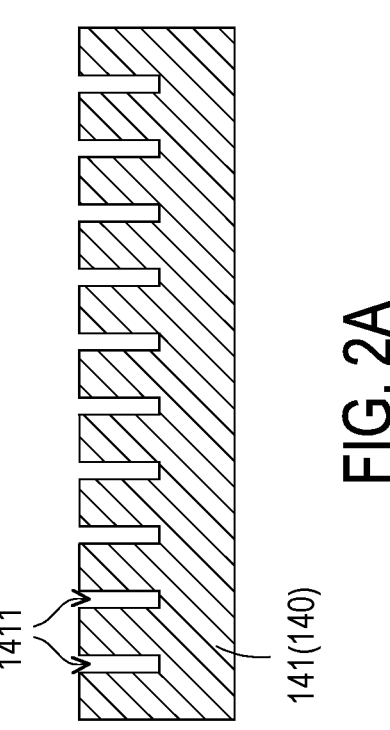
Figure 3:
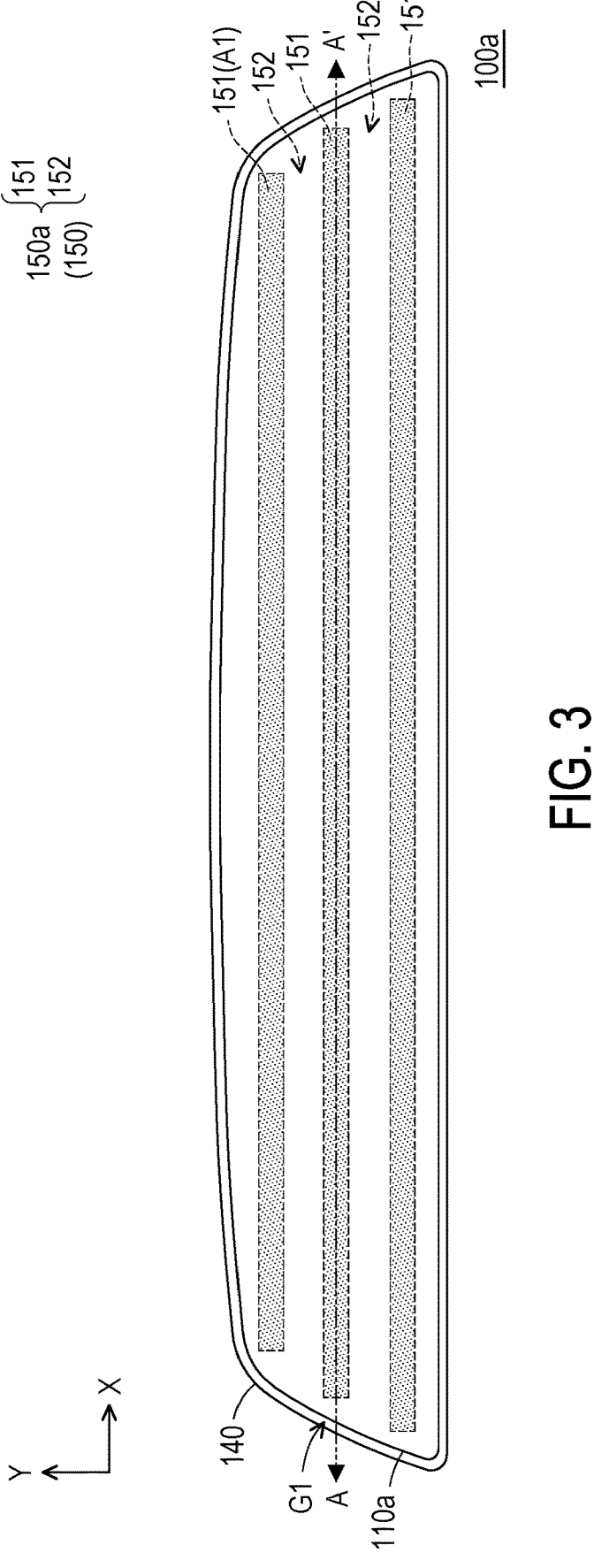
FIG. 3 is a schematic top view of the electronic device of FIG. 1D.
Figure 4:
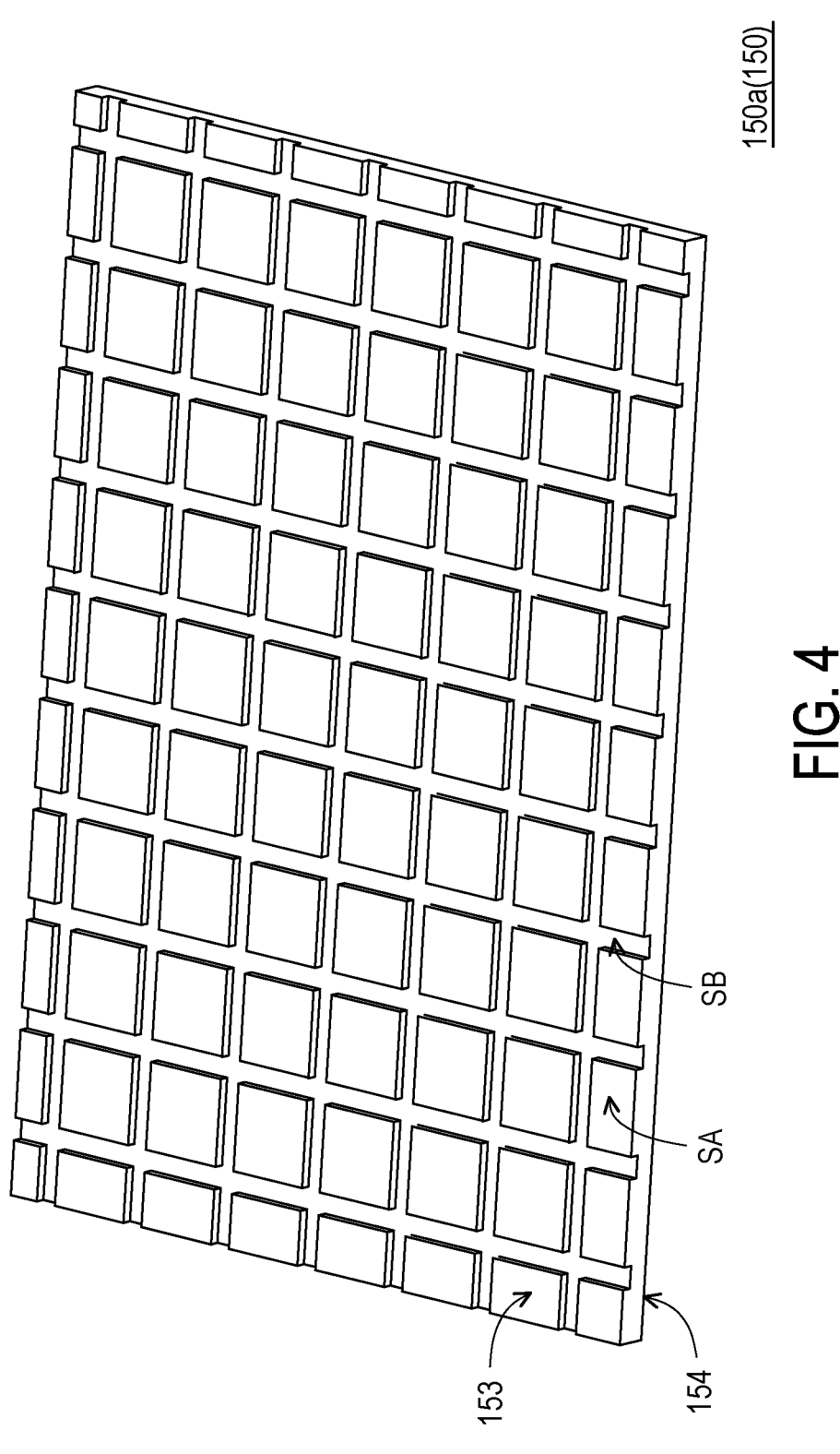
FIG. 4 is a partial perspective view of the adhesive in FIG. 1D.
Figures 5A, 5B, 5C:
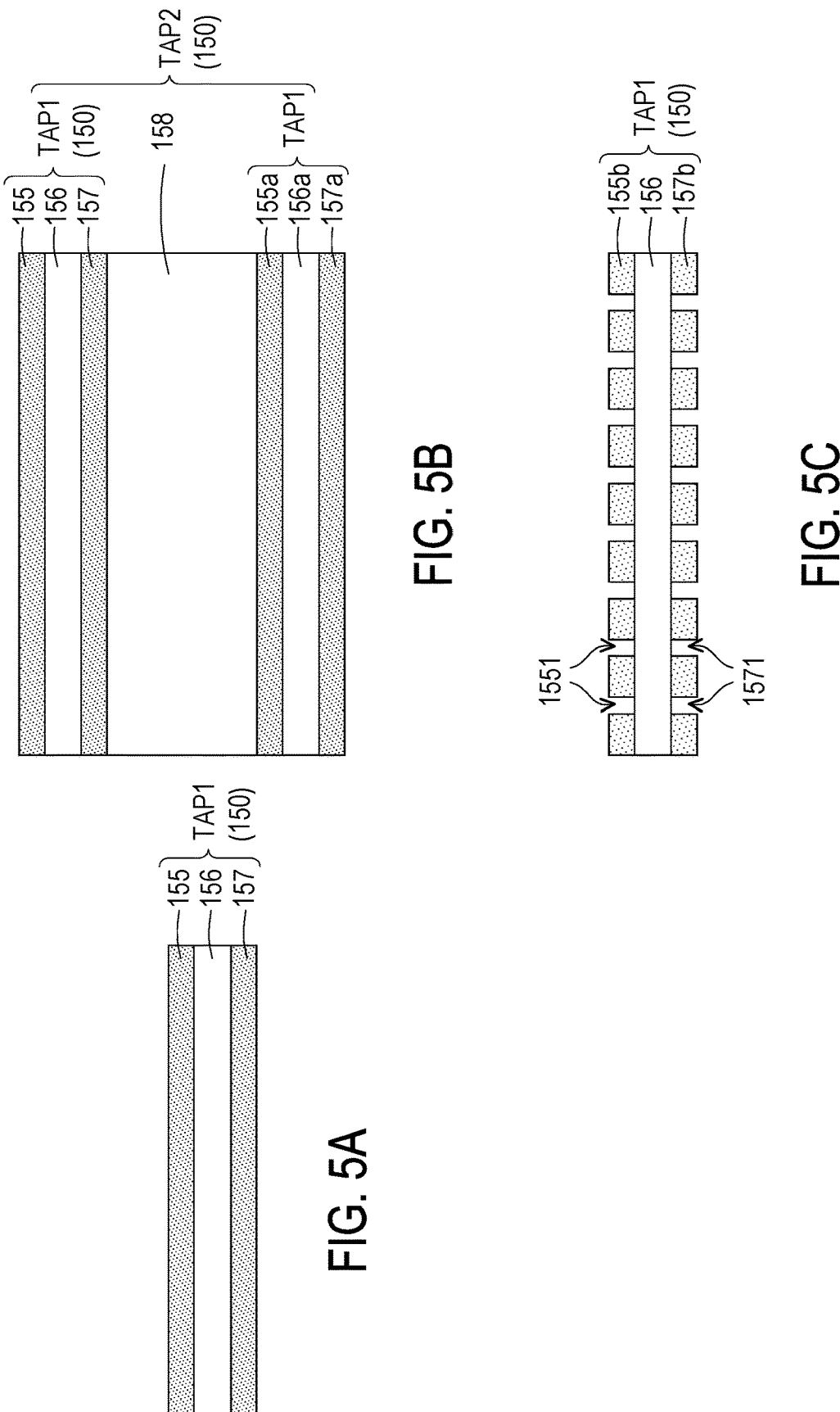
FIG. 5A to FIG. 5C are partial cross-sectional schematic views of the adhesives of various embodiments of the disclosure.

FIG. 1A to FIG. 1D are schematic cross-sectional views of a method for manufacturing an electronic device according to an embodiment of the disclosure. FIG. 2A to FIG. 2B are partial cross-sectional schematic views of the back frame of various embodiments of the disclosure. FIG. 3 is a schematic top view of the electronic device of FIG. 1D, and FIG. 1D may be, for example, a schematic cross-sectional view of the section line A-A' of FIG. 3. FIG. 4 is a partial perspective view of the adhesive in FIG. 1D. FIG. 5A to FIG. 5C are partial cross-sectional schematic views of the adhesives of various embodiments of the disclosure. For clarity and convenience of illustration, FIG. 3 omits to show some elements in an electronic device 100a (such as an electronic element 112 and a reflective structure 113).

Figure 1B:
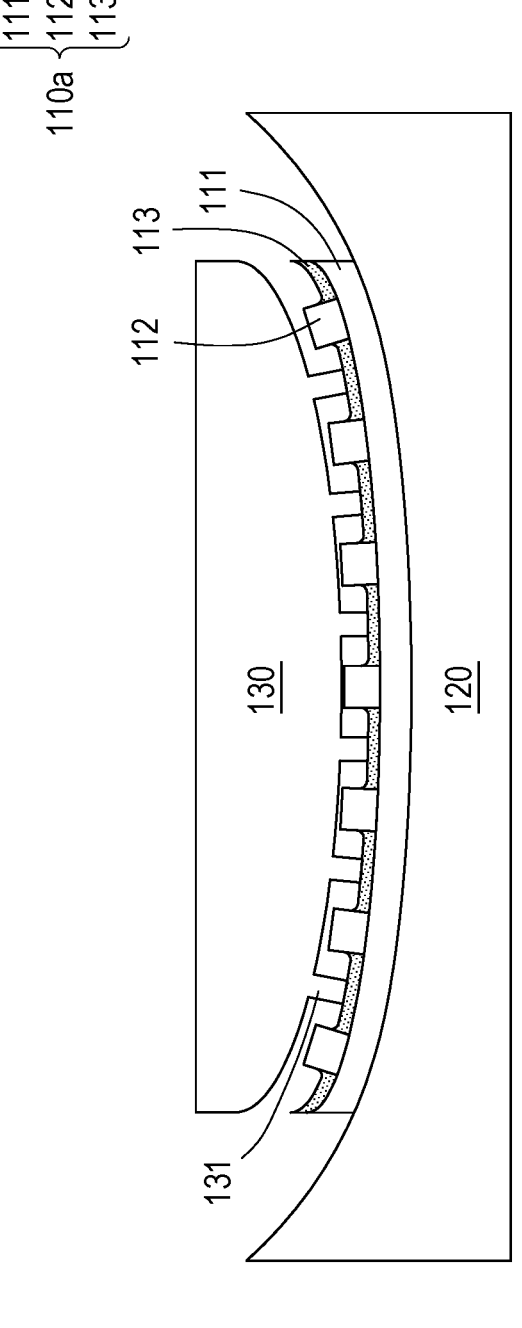

In this embodiment, the manufacturing method of the electronic device 100a may include the following steps:

Please refer to FIG. 1A and FIG. 1B first, a circuit board 110 is provided, and a first pre-bending step is performed on the circuit board 110, so that the circuit board 110 is bent to have a radius of curvature CR1.

In this embodiment, the circuit board 110 before performing the first pre-bending step may be a non-curved (or planar) structure, and the radius of curvature of the circuit board 110 may be greater than 5000 mm, but is not limited thereto. The circuit board 110 includes a substrate 111, a plurality of electronic components 112 and/or a reflective structure 113, but is not limited thereto. The substrate 111 may include a driving substrate, and the driving substrate may include driving circuits such as transistors, capacitors, and/or power supplies, but is not limited thereto. The driving substrate may be electrically connected to the electronic component 112 and used to drive the electronic component 112. The electronic component 112 may be exemplified as above. In this embodiment, the substrate 111 may include a rigid substrate, a flexible substrate or a combination thereof. For example, a material of the substrate 111 may include glass, quartz, sapphire, ceramics, polycarbonate (PC), polyimide (PI), polyethylene terephthalate (PET), epoxy resin fiberglass, other suitable substrate materials, or a combination of the foregoing, but is not limited thereto.

In this embodiment, a plurality of electronic components 112 may be disposed on the substrate 111. The electronic component 112 may be, for example, a light emitting diode arranged by surface mount device (SMD), flip chip or chip on board (COB), but is not limited thereto. The light emitting diode may include red light emitting diode, green light emitting diode, blue light emitting diode and/or white light emitting diode, but is not limited thereto.

In this embodiment, the reflective structure 113 is disposed on the substrate 111 and adjacent to the electronic component 112. The reflective structure 113 surrounds the electronic component 112, for example, but is not limited thereto. In a normal direction Z of the substrate 111, for example, the reflective structure 113 does not overlap with the electronic component 112. A material of the reflective structure 113 may include white glue, white ink, metal reflective material, other suitable high reflective materials or a combination thereof, but is not limited thereto.

In this embodiment, the first pre-bending step may include the following steps: first, please refer to FIG. 1A, the circuit board 110 is disposed on a curved carrier 120 so that the non-curved (or planar) circuit board 110 may be pre-bent to a circuit board 110a due to gravity. A radius of curvature of the carrier 120 may be, for example, less than 5000 mm, but is not limited thereto. Next, please refer to FIG. 1B, a vacuum adsorption nozzle 131 of a adsorption mechanism 130 is aligned with the reflective structure 113, for example, to adsorb the circuit board 110a through the adsorption mechanism 130, so that the circuit board 110a is bent to a curved surface with a radius of curvature CR1 and the circuit board 110a is detached from the carrier 120. The above "a vacuum adsorption nozzle 131 of an adsorption mechanism 130 is aligned with the reflective structure 113" is, for example, overlapping the vacuum adsorption nozzle 131 with the reflective structure 113. In other words, the vacuum adsorption nozzle 131 of the adsorption mechanism 130 is not aligned (not overlapped) with the electronic component 112, for example. The radius of curvature CR1 of the circuit board 110a may be, for example, less than 5000 mm (CR1<5000 mm), and a difference between the radius of curvature CR1 and the radius of curvature of the adsorption mechanism 130 may be within 10%, but is not limited thereto. So far, the first pre-bending step has been substantially completed.

Figure 1C:
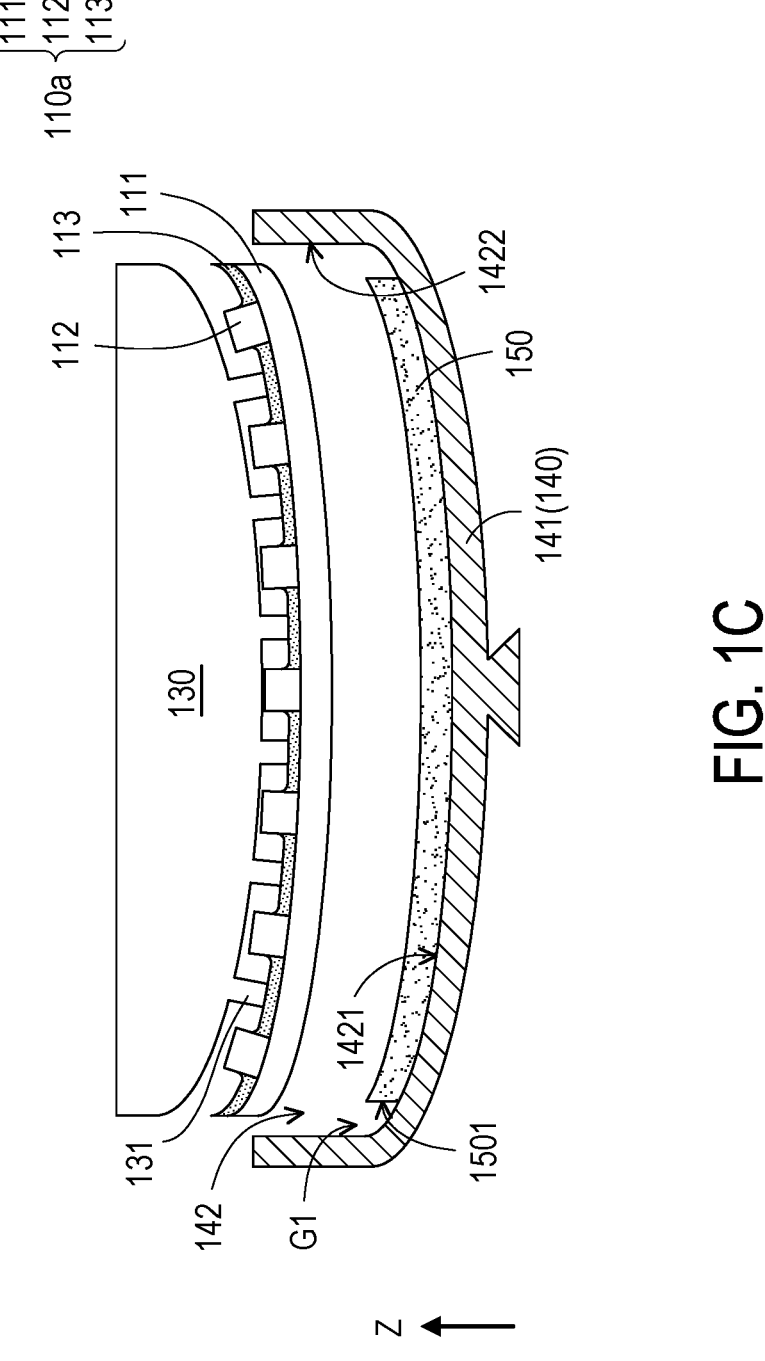

Then, please refer to FIG. 1C, a back frame 140 having a radius of curvature CR2 is provided. The radius of curvature CR2 of the back frame 140 may be less than 5000 mm (CR2<5000 mm), and a difference between the radius of curvature CR2 and the radius of curvature CR1 may be within 10%, but is not limited thereto.

In some embodiments, a material of the back frame 140 may include metal, plastic, ceramics, other suitable materials or any combination of the above. In some embodiments, the back frame 140 has a curved surface, the back frame 140 includes a curved frame 141 and a sidewall 1422 connected to the curved frame 141, and the curved frame 141 has a bottom surface 1421. The back frame 140 includes an accommodating groove 142.

Please refer to FIG. 2A and FIG. 2B, in the partial cross-sectional schematic view of the curved frame 141 of the back frame 140, the curved frame 141 may have at least one groove 1411 (as shown in FIG. 2A) or at least one through hole 1412 (as shown in FIG. 2B). The groove 1411 or the through hole 1412 may be used to eliminate air bubbles generated between the adhesive 150 and the curved frame 141 when the circuit board 110a is subsequently laminated, so as to improve the adhesive effect or flatness of the adhesive 150. For example, in FIG. 2A, a plurality of grooves 1411 of the curved frame 141 may be designed to be separated from each other. These grooves 1411 are arranged in sequence, so that a contour shape of the cross section of the curved frame 141 is, for example, comb-shaped, but is not limited thereto. In some embodiments, the plurality of grooves may be designed in a staggered grid or in other arrangements. In FIG. 2B, a plurality of through holes 1412 penetrate through the curved frame 141, for example.

Please continue to refer to FIG. 1C, the adhesive 150 is disposed on the back frame 140 (such as the bottom surface 1421), and the circuit board 110a which is adsorbed on the adsorption mechanism 130 and has the radius of curvature CR1 is placed in the accommodation groove 142 of the back frame 140, so that the circuit board 110a is disposed on the adhesive 150.

Figure 1D:
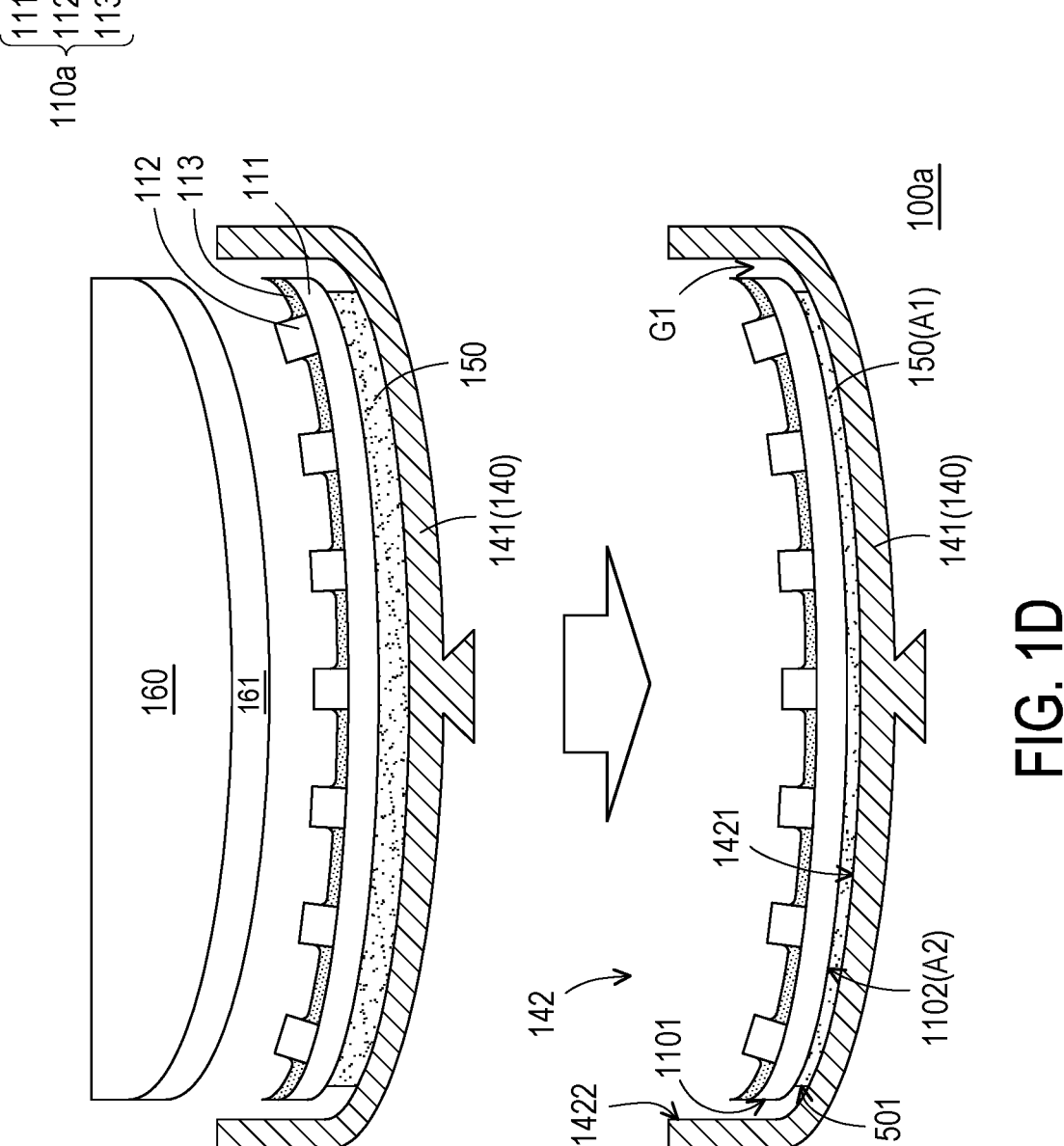

Then, please refer to FIG. 1D, when the circuit board 110a having the first radius of curvature CR1 is attached to the back frame 140 through the adhesive 150, the circuit board 110a is pressed using a pressing mechanism 160 having a radius of curvature CR3, so that the circuit board 110a may be closely attached to the back frame 140 through the adhesive 150, and the electronic device 100a of this embodiment is completed. A difference between the radius of curvature CR3 and the radius of curvature CR2 may be, for example, within 10%, but is not limited thereto. The radius of curvature CR3 of the pressing mechanism 160 may be, for example, less than 5000 mm, but is not limited thereto.

In some embodiments, the pressing mechanism 160 has a buffer member 161. The buffer member 161 may be disposed on a surface of the pressing mechanism 160 facing (adjacent to) the circuit board 110a, so as to reduce the chance of the pressing mechanism 160 causing damage to the circuit board 110a or the electronic components 112 thereon when the circuit board 110a is pressed to the back frame 140. The buffer member 161 may include soft cushioning material, such as foam or other suitable materials.

In some embodiments, in the normal direction Z of the substrate 111, an area of the accommodating groove 142 is, for example, larger than an area of the circuit board 110a. In some embodiments, there may be a gap G1 between the sidewall 1422 and an edge 1101 of the circuit board 110*a*. In some embodiments, in the normal direction Z of the substrate 111, a width of the gap G1 may be, for example, 0.1 mm to 20 mm (0.1 mm≤gap G1≤20 mm), but is not limited thereto. In some embodiments, in the normal direction Z of the substrate 111, the width of the gap G1 may be, for example, 0.3 mm to 15 mm (0.3 mm≤gap G1≤15 mm), but is not limited thereto. The above-mentioned width of the gap G1 may be defined as a minimum distance between the sidewall 1422 and the edge 1101 of the circuit board 110*a*.

In some embodiments, the adhesive 150 may be used to fix the circuit board 110*a* on the back frame 140, and the adhesive 150 may be used to transfer the heat generated by the circuit board 110*a* to the back frame 140, so as to improve the heat dissipation effect of the circuit board 110*a*, but it is not limited thereto. In some embodiments, in a cross-section, the edge 1101 of the circuit board 110*a* is not aligned with the edge 1501 of the adhesive 150, for example. In some embodiments, in a cross-section, the edge 1101 of the circuit board 110*a* may protrude from the edge 1501 of the adhesive 150. In some embodiments, in a cross-section, the edge 1101 of the circuit board 110*a* is aligned with the edge 1501 of the adhesive 150, for example.

Figure 6:
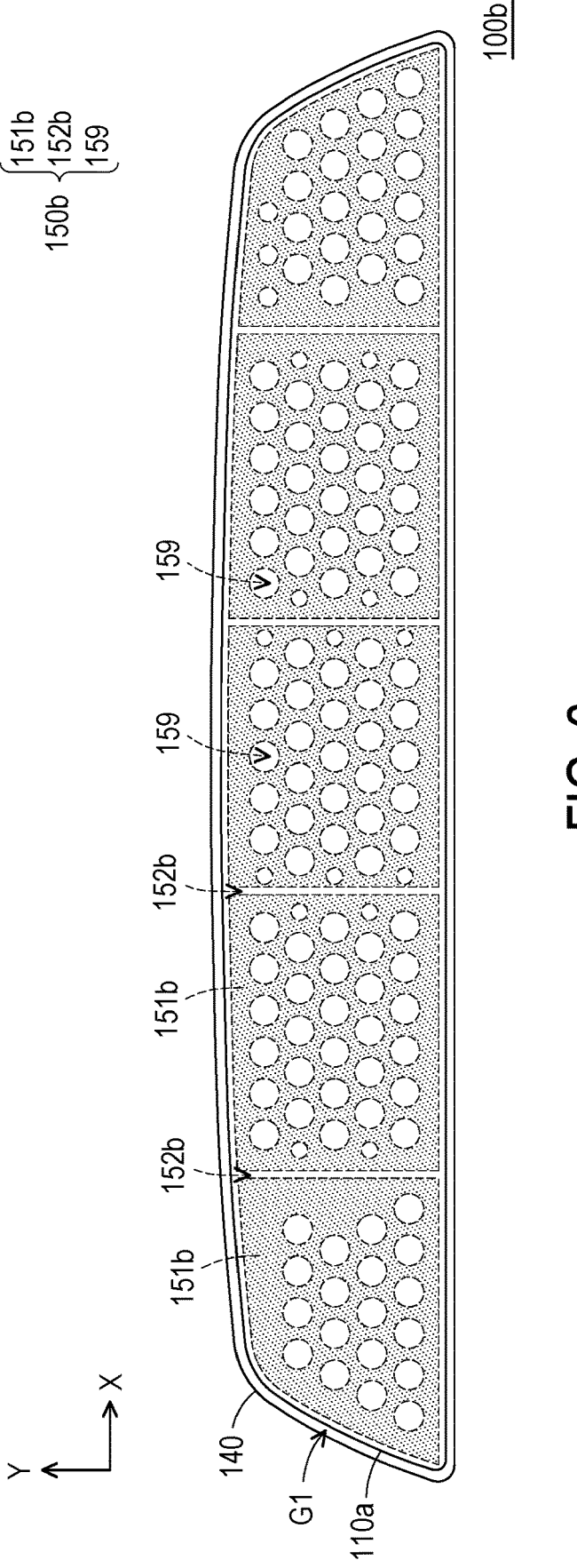
FIG. 6 is a schematic top view of an electronic device according to another embodiment of the disclosure.
Figure 7:
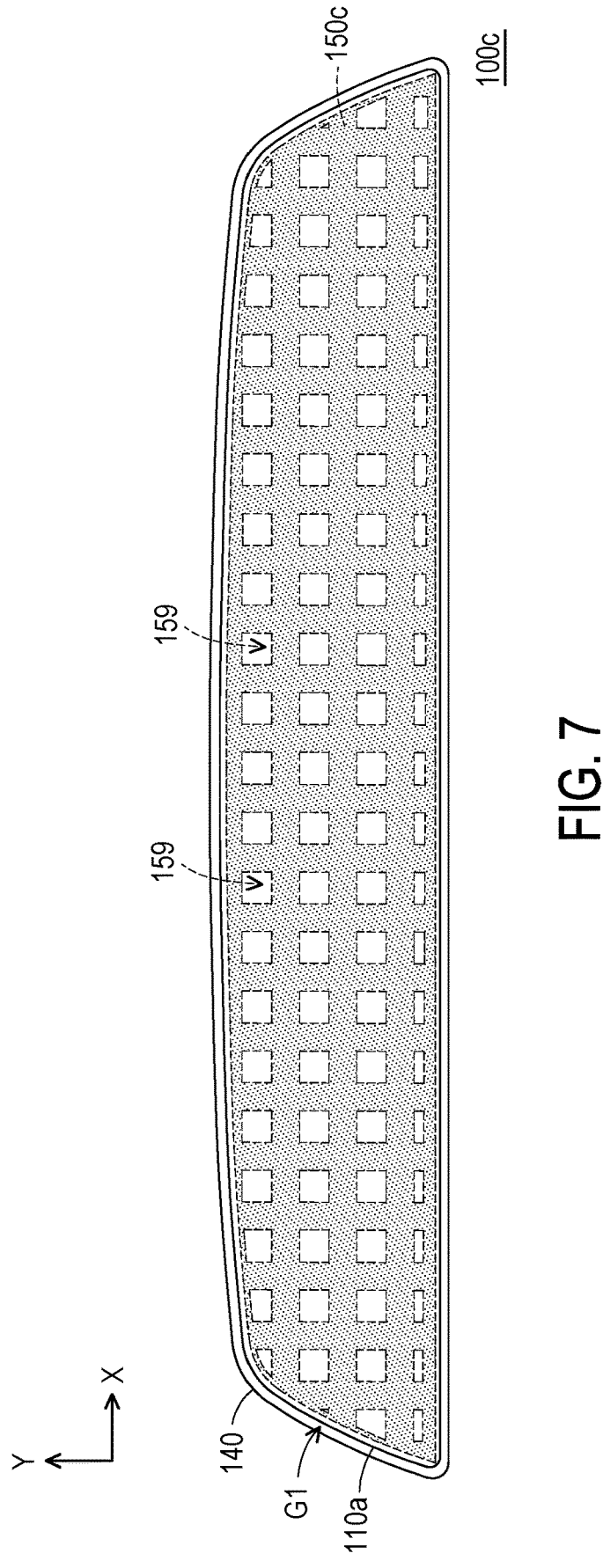
FIG. 7 is a schematic top view of an electronic device according to another embodiment of the disclosure.

Please refer to FIG. 3, in the schematic top view of the electronic device 100*a* of this embodiment, the adhesive 150 may be a patterned adhesive 150*a*. In some embodiments, the patterned adhesive 150*a* may include a plurality of sub-parts 151 separated from each other, and the plurality of sub-parts 151 overlap the circuit board 110*a*. There is, for example, a gap 152 between the sub-parts 151. The design of the gap 152 may be used to eliminate air bubbles between the patterned adhesive 150*a* and the bonding object (such as the circuit board 110*a* and the curved frame 141) when the circuit board 110*a* is subsequently laminated, so as to improve the adhesion effect or flatness of the patterned adhesive 150*a*. The plurality of sub-parts 151 may overlap a portion of the circuit board 110*a*, and the gap 152 may overlap another portion of the circuit board 110*a*. In this embodiment, although the patterned adhesive 150*a* includes three sub-parts 151 separated from each other, and a contour shape of the sub-parts 151 is, for example, a long strip, but the disclosure does not limit the arrangement, quantity and contour shape of the sub-parts in the patterned adhesive. In some embodiments, the number of sub-parts may be adjusted as needed. In some embodiments, the contour shape of the sub-parts may also include rectangles or other geometric shapes. In some embodiments, the gaps may for example, form a grid, but are not limited thereto. In some embodiments, the patterned adhesive (or sub-parts) may include at least one through hole (as shown in FIG. 6). In some embodiments, the plurality of patterned adhesives may form a grid (as shown in FIG. 7), but is not limited thereto. These different types of patterned adhesives will be described in detail later.

Please refer to FIG. 4, in a partial perspective view of the adhesive 150 of this embodiment, the patterned adhesive 150*a* may have a first surface 153 and a second surface 154 opposite to each other. The first surface 153 faces the circuit board 110*a*, and the second surface 154 faces the back frame 140. The patterned adhesive 150*a* may have a concave-convex surface. A convex surface SA of the concave-convex surface may be used, for example, to contact the bonding object (such as the circuit board 110*a* or the curved frame 141), while a concave surface SB of the concave-convex surface may be used, for example, to eliminate air bubbles between the patterned adhesive 150*a* and the bonding object (such as the circuit board 110*a* or the curved frame 141) when the circuit board 110*a* is subsequently laminated, so as to improve the adhesion effect or flatness of the patterned adhesive 150*a*. In some embodiments, the concave-convex surface may be disposed on the first surface 153, and the concave-convex surface may be adjacent to the circuit board 110*a*, but is not limited thereto. In some embodiments, the concave-convex surface may also be disposed on the second surface 154, and the concave-convex surface may also be far away from the circuit board 110*a*. In some embodiments, the concave surface SB may be substantially grid-shaped, for example, but is not limited thereto. In some embodiments, in the normal direction Z of the substrate 111, a ratio of a thickness of the concave surface SB to a thickness of the convex surface SA may be, for example, between 0.1 to 0.9 (0.1≤ratio≤0.9), between 0.15 to 0.85 (0.15≤ratio≤0.85) or between 0.2 to 0.8 (0.2≤ratio≤0.8), but is not limited thereto.

Please refer to FIG. 5A to FIG. 5C, in the partial cross-sectional schematic view of the adhesive 150 of this embodiment, the adhesive 150 may be a single-layer adhesive or a multi-layer adhesive. The adhesive 150 may be a double-sided tape TAP1 (as shown in FIG. 5A and FIG. 5C) or a double-sided tape TAP2 (as shown in FIG. 5B) consisting of two double-sided tapes TAP1 sandwiching a buffer layer 158, but is not limited thereto. Specifically, in FIG. 5A, when the adhesive 150 is a double-sided tape TAP1, the adhesive 150 may include a glue layer 155, a base material 156 and a glue layer 157, and the base material 156 may be disposed between the glue layer 155 and the glue layer 157. An elastic modulus of the glue layer 155 and the glue layer 157 may be greater than an elastic modulus of the base material 156. A material of the base material 156 may include non-woven fabric or other suitable polymeric organic materials, but is not limited thereto. In some embodiments, the base material 156 may be selectively removed between the glue layer 155 and the glue layer 157. In some embodiments, the glue layer 155 and the glue layer 157 may be made of the same or different materials.

In FIG. 5B, when the adhesive 150 is a double-sided tape TAP2 consisting of two double-sided tapes TAP1 sandwiching a buffer layer 158, the adhesive 150 may include a glue layer 155, a base material 156, a glue layer 157, a buffer layer 158, a glue layer 155*a*, a base material 156*a* and a glue layer 157*a*, but is not limited thereto. The base material 156 is disposed between the glue layer 155 and the glue layer 157, the buffer layer 158 is disposed between the glue layer 157 and the glue layer 155*a*, and the base material 156*a* is disposed between the glue layer 155*a* and the glue layer 157*a*, but is not limited thereto. In some embodiments, any of the above layers may be selectively removed. In some embodiments, the glue layer 155, the glue layer 157, the glue layer 155*a* and the glue layer 157*a* may be the same or different materials. In some embodiments, the base material 156 and the base material 156*a* may be the same or different materials.

An elastic modulus of the buffer layer 158 may be greater than an elastic modulus of the glue layer 155 and the glue layer 157, but is not limited thereto. The elastic modulus of the buffer layer 158 may be greater than the elastic modulus of the base material 156 or the base material 156*a*. A material of the buffer layer 158 may include polyurethane (PU) or other suitable materials, but is not limited thereto.

In some embodiments, the adhesive may include a single layer glue. In some embodiments (not shown), the adhesive may consist of two glue layers sandwiching a buffer layer. In some embodiments, the adhesive may also be formed by mixing and matching the following different styles.

In FIG. 5C, the glue layer 155b may include a plurality of grooves 1551, and the glue layer 157b may include a plurality of grooves 1571. The grooves 1551, 1571 may be used to eliminate air bubbles between the adhesive 150 and the bonding object (such as the circuit board 110a or the curved frame 141), so as to improve the adhesion effect or flatness of the adhesive 150. The groove 1551 of the glue layer 155b may expose a surface (not shown) of a portion of the base material 156. The groove 1571 of the glue layer 157b may expose another surface (not shown) of the portion of the base material 156, but is not limited thereto. In some embodiments (not shown), the groove 1551 and the groove 1571, for example, do not expose a portion of the base material 156. In some embodiments, the plurality of grooves 1551 (or the plurality of grooves 1571) may be designed to be separated from each other and arranged in sequence, so that a contour shape of the adhesive 150 is comb-like, but is not limited thereto. In some embodiments (not shown), the plurality of grooves 1551 (or the plurality of grooves 1571) may also be designed to substantially overlap each other, but is not limited thereto. In some embodiments (not shown), the plurality of grooves 1551 (or the plurality of grooves 1571) may also be designed in a grid shape interlaced with each other. In some embodiments, a plurality of through-holes (not shown) penetrated the double-sided tape TAP1 or the double-sided tape TAP2 may be provided in the adhesive; the through-holes, for example, penetrate all the layers in the adhesive, so as to eliminate air bubbles between the adhesive and the bonding object (such as circuit board or curved frame), but is not limited thereto.

Based on the above, as shown in FIG. 1D and FIG. 3, the electronic device 100a of this embodiment may include the back frame 140, the circuit board 110a and the patterned adhesive 150a. The back frame 140 has the first curved surface. The circuit board 110a is disposed on the back frame 140 and has the second curved surface. The patterned adhesive 150a is disposed between the back frame 140 and the circuit board 110a. The patterned adhesive 150a (or the adhesive 150) has an adhesive area A1 attached to the circuit board 110a, a surface 1102 of the circuit board 110a adjacent to the patterned adhesive 150a has a surface area A2, and the adhesive area A1 and the surface area A2 may for example, meet the following relationship: a ratio of the adhesive area A1 to the surface area A2 is greater than or equal to 30% and less than or equal to 99% (30%≤A1/A2≤99%), but is not limited thereto. When the adhesive area/the surface area is less than 30%, it means that the adhesive area between the patterned adhesive 150a and the circuit board 110a is too small to fix the circuit board 110a or cause poor heat dissipation effect of the circuit board 110a. When the adhesive area/the surface area is 100%, it means that there is no extra space between the adhesive 150 and the circuit board 110a to eliminate air bubbles, which makes it difficult to remove air bubbles. In some embodiments, the adhesive area A1 and the surface area A2 may also meet the following relationship: a ratio of the adhesive area A1 to the surface area A2 is greater than or equal to 30% and less than or equal to 80% (30%≤A1/A2≤80%). In some embodiments, the adhesive area A1 and the surface area A2 may also meet the following relationship: a ratio of the adhesive area A1 to the surface area A2 is greater than or equal to 30% and less than or equal to 70% (30%≤A1/A2≤70%).

In the electronic device and its manufacturing method of this embodiment, the non-curved or planar circuit board 110 is first bent to have the radius of curvature similar to that of the back frame 140 through the first pre-bending step, so that a chance of cracking the circuit board 110a may be reduced when the circuit board 110a having the curved surface is pressed down and attached to the curved back frame 140. On the contrary, if the non-curved or planar circuit board 110 is directly pressed down and attached to the curved back frame 140, the non-curved or planar circuit board 110 will easily be broken.

Other embodiments are listed below for description. It must be noted here that the following embodiments adopt the reference numerals and part of the content of the above embodiments, wherein the same reference numerals are used to represent the same or similar elements, and the description of the same technical content is omitted. For the description of the omitted parts, reference may be made to the above embodiments, which is not repeated in the following embodiments.

FIG. 6 is a schematic top view of an electronic device according to another embodiment of the disclosure. Please refer to FIG. 3 and FIG. 6 at the same time. The electronic device 100b of this embodiment is similar to the electronic device 100a in FIG. 3. The electronic device 100b of this embodiment is different from the electronic device 100a in that, in the electronic device 100b of this embodiment, a sub-part 151b of a patterned adhesive 150b includes at least one through hole 159.

Specifically, please refer to FIG. 6, in this embodiment, the patterned adhesive 150b may include a plurality of sub-parts 151b. For example, there are gaps 152b between the plurality of sub-parts 151b. The plurality of sub-parts 151b are separated from each other, and a contour shape of the plurality of sub-parts 151b may be trapezoidal or rectangular, but is not limited thereto. A size or shape of the plurality of sub-parts 151b may be the same or different. The sub-parts 151 may for example, include at least one through hole 159, and the at least one through hole 159 may pass through the patterned adhesive 150b to expose part of the back frame 140, but is not limited thereto.

In this embodiment, the design of the gap 152b and the through hole 159 may be used to eliminate air bubbles between the patterned adhesive 150b and the bonding object (such as the circuit board 110a or the curved frame 141) when the circuit board 110a is subsequently laminated, so as to improve the adhesion effect or flatness of the patterned adhesive 150b. In some embodiments, a density or shape of the through holes 159 in different sub-parts 151b may be the same or different. In some embodiments (not shown), a density of the through holes 159 in the relatively middle sub-parts 151b may be different from a density of the through holes 159 in the sub-parts 151b on both sides. In some embodiments, the plurality of sub-parts 151b may not include the through holes 159. In some embodiments (not shown), the adhesive 150b may not include a plurality of sub-parts 151b, but the adhesive 150b may include at least one through hole 159.

FIG. 7 is a schematic top view of an electronic device according to another embodiment of the disclosure. Please refer to FIG. 3 and FIG. 7 at the same time. The electronic device 100c of this embodiment is similar to the electronic device 100a in FIG. 3. The electronic device 100c of this embodiment is different from the electronic device 100a in that, in the electronic device 100c of this embodiment, a patterned adhesive 150c may be in a grid shape, for example.

Specifically, please refer to FIG. 7, in this embodiment, the patterned adhesive 150c may include a plurality of through holes 159, and the plurality of through holes 159, for example, are arranged sequentially along a first direction X and/or along a second direction Y. Sizes and shapes of the through holes 159 may be different or the same. In some embodiments, the through hole 159 near the edge of the back frame 140 may have a curved edge, but is not limited thereto.

The design of the above-mentioned through hole 159 may be used to eliminate air bubbles between the patterned adhesive 150c and the bonding object (such as the circuit board 110a and the curved frame 141) when the circuit board 110a is subsequently laminated, so as to improve the adhesion effect or flatness of the patterned adhesive 150c.

Figure 8:
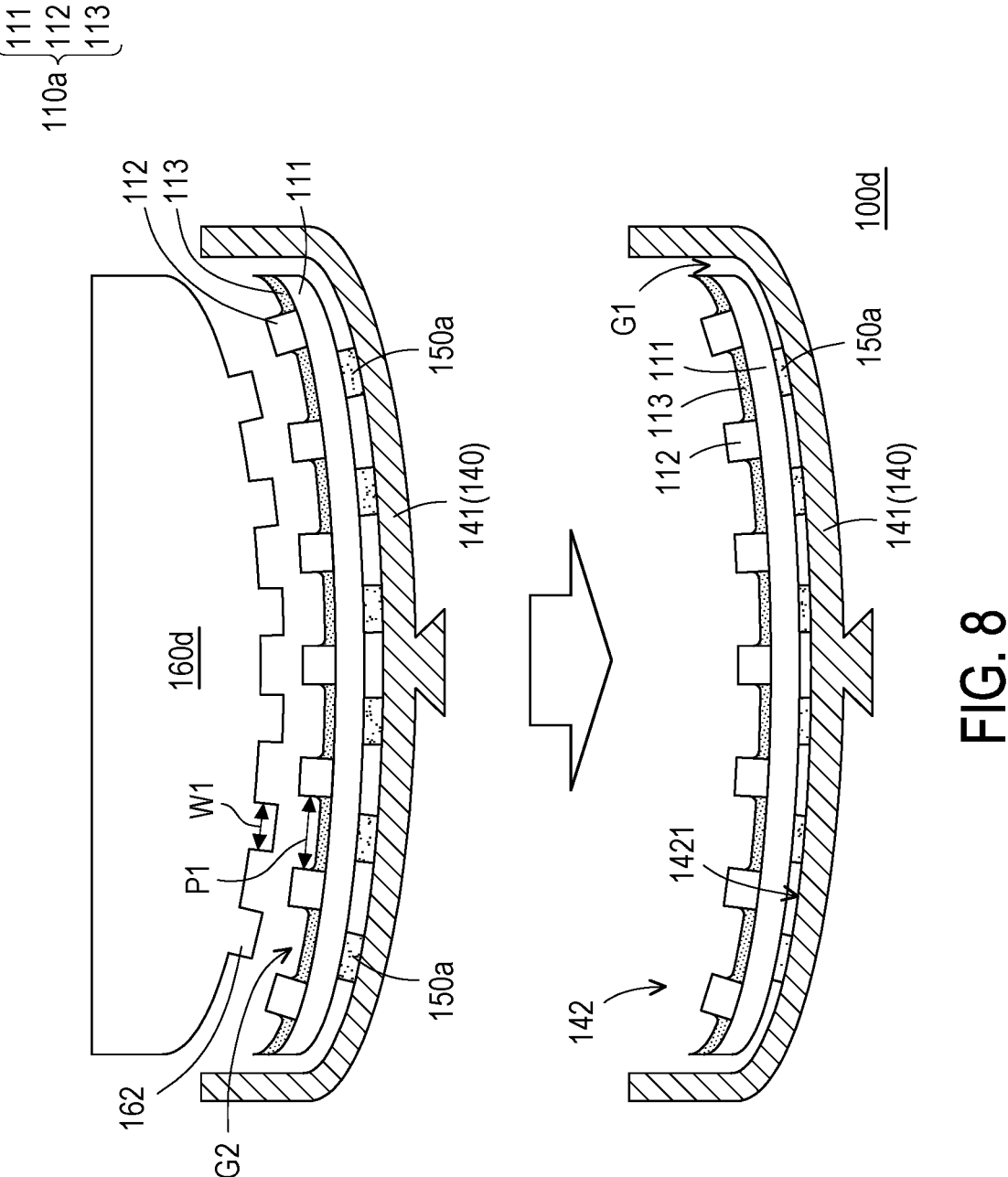
FIG. 8 is a schematic cross-sectional view of a method for manufacturing an electronic device according to another embodiment of the disclosure.

FIG. 8 is a schematic cross-sectional view of a method for manufacturing an electronic device according to another embodiment of the disclosure. FIG. 8 is a step continuing FIG. 1C and replacing FIG. 1D. The same or similar components in the embodiment of FIG. 8 and the embodiment of FIGS. 1A to 1C may be applied using the same materials or methods, so the same and similar descriptions in the two embodiments will not be repeated herein, and the main difference between the two embodiments will be described.

Specifically, please refer to FIG. 8, in the manufacturing method of the electronic device 100d of this embodiment, the pressing mechanism 160 in FIG. 1D is replaced by a pressing mechanism 160d. The pressing mechanism 160d may have a plurality of pressing bars 162. The pressing bars 162 may be used to replace the buffer member 161 of the pressing mechanism 160 in FIG. 1D and be disposed on a surface of the pressing mechanism 160d facing the circuit board 110a. In some embodiments, since the pressing bars 162 is, for example, a rigid material, the pressing bars 162 is, for example, aligned with a position on the circuit board 110a where the electronic component 112 is not provided (that is, the pressing bars 162 do not overlap a plurality of electronic components 112 in the normal direction Z) when using the pressing mechanism 160d for pressing, so as to reduce the possibility of crushing the electronic components 112 during pressing. In some embodiments, a width W1 of the pressing bars 162 is, for example, smaller than a width P1 of a gap G2 between two adjacent electronic components 112. In some embodiments, a ratio of the width W1 of the pressing bars 162 to the width P1 of the gap G2 between two adjacent electronic components 112 may be between 0.2 and 0.8 (0.2≤ratio≤0.8), but is not limited thereto. In some embodiments, the ratio of the width W1 of the pressing bars 162 to the width P1 of the gap G2 between two adjacent electronic components 112 may be between 0.3 and 0.7 (0.3≤ratio≤0.7), but is not limited thereto. In some embodiments, the ratio of the width W1 of the pressing bars 162 to the width P1 of the gap G2 between two adjacent electronic components 112 may be between 0.35 and 0.65 (0.35≤ratio≤0.65), but is not limited thereto.

In addition, since a position where the pressing bars 162 pressing is, for example, a position of the gap G2 between two adjacent electronic components 112, a position of the patterned adhesive 150a disposed in the accommodating groove 142 is, for example, substantially overlaps the position where the pressing bars 162 pressing. In other words, the patterned adhesive 150a overlaps the gap G2 between two adjacent electronic components 112 or the pressing bars 162 in the normal direction Z of the substrate 111.

Figure 9A:
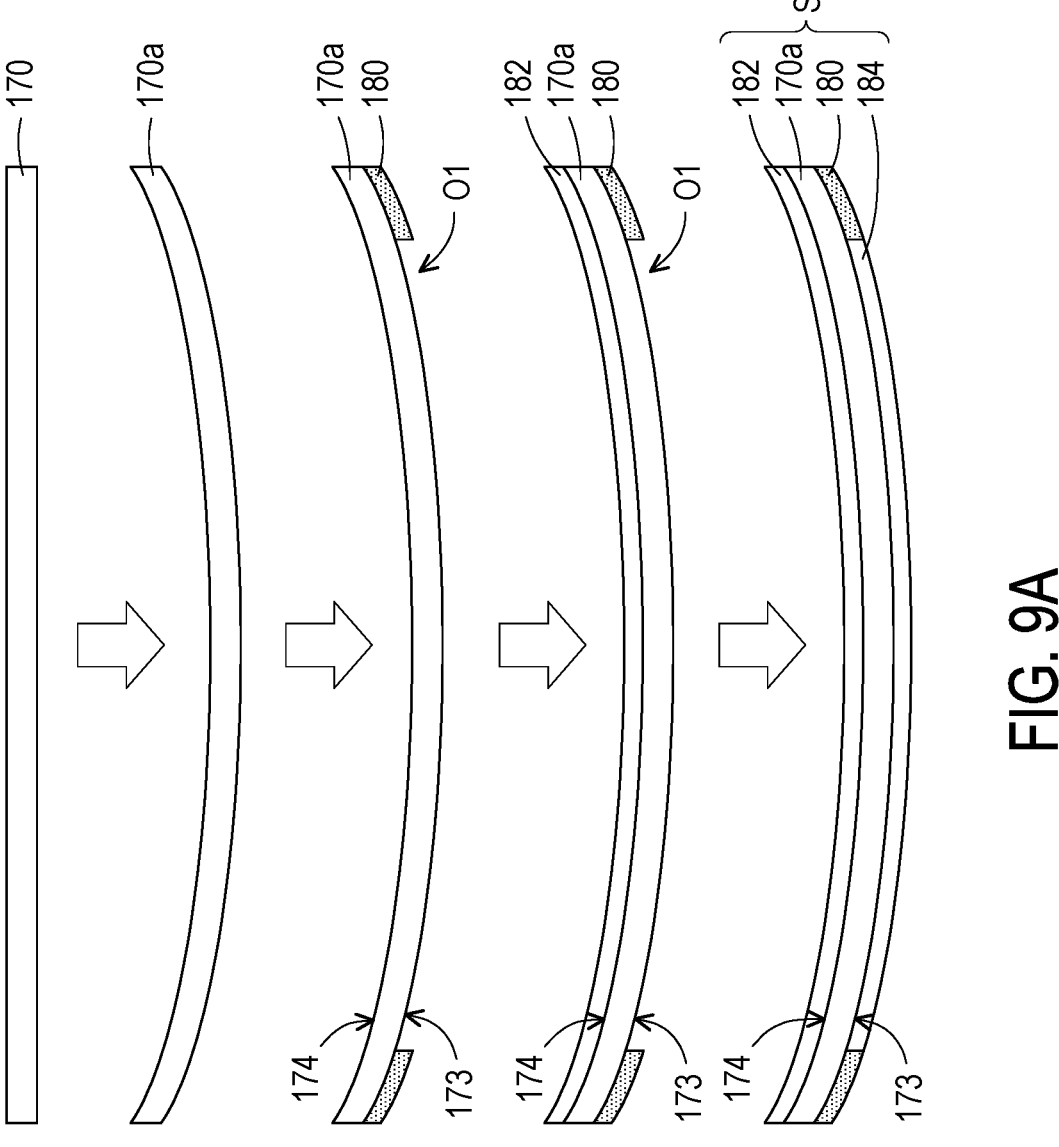
FIG. 9A to FIG. 9B are schematic cross-sectional views of a method for manufacturing an electronic device according to another embodiment of the disclosure.
Figure 9B:
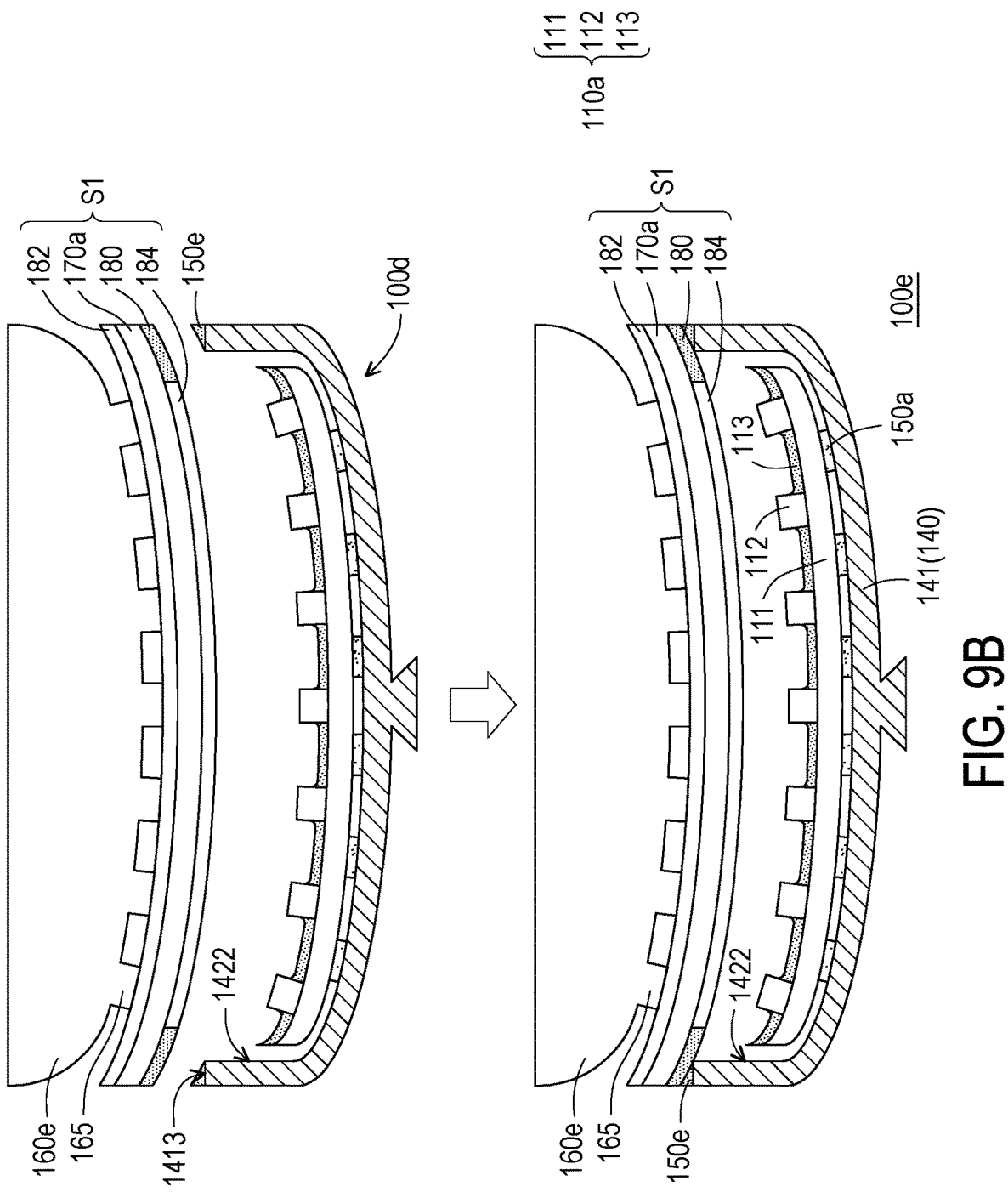

FIG. 9A to FIG. 9B are schematic cross-sectional views of a method for manufacturing an electronic device according to another embodiment of the disclosure. FIG. 9A to FIG. 9B are steps continuing FIG. 8. The same or similar components in the embodiment of FIG. 9A to FIG. 9B and the embodiment of FIG. 8 may be applied using the same materials or methods, so the same and similar descriptions in the two embodiments will not be repeated herein, and the main difference between the two embodiments will be described.

In this embodiment, the manufacturing method of the electronic device 100e may include the following steps:

Please refer to FIG. 9A, after the electronic device 100d of FIG. 8 is manufactured, a protective substrate 170 is provided, and a second pre-bending step is performed on the protective substrate 170 to bend the protective substrate 170 to obtain a protective substrate 170a having a radius of curvature CR4. Specifically, in this embodiment, the protective substrate 170 before performing the second pre-bending step may be, for example, a non-curved or a planar structure, and a radius of curvature of the protective substrate 170 at this time may be, for example, greater than 8000 millimeters (mm), but is not limited thereto. The protective substrate 170 may have a third surface 173 and a fourth surface 174 opposite to each other. When the protective substrate 170 is subsequently assembled to the back frame 140, the third surface 173 may for example, face (be adjacent to) the back frame 140, and the fourth surface 174 may for example, face away from (be far away from) the back frame 140. A material of the protective substrate 170 may include glass, plastic, ceramics, and other suitable materials, but is not limited thereto.

In this embodiment, the second pre-bending step may include the following steps: a process temperature is provided so that the non-curved or planar protective substrate 170 may be bent to a curved protective substrate 170a having a radius of curvature CR4. The process temperature in the second pre-bending step may be, for example, between 600° C. and 900° C. (600° C.≤temperature≤900° C.), between 600° C. and 850° C. (600° C.≤temperature≤850° C.), or between 600° C. and 800° C. (600° C.≤temperature≤800° C.), but is not limited thereto. Subsequently, the back frame 140 with the radius of curvature CR2 is provided, so that the protective substrate 170a with the radius of curvature CR4 is assembled to the back frame 140.

In some embodiments, the radius of curvature CR2 of the back frame 140 may be smaller than the radius of curvature CR4 of the protective substrate 170a, for example. In some embodiments, a difference between the radius of curvature CR4 of the protective substrate 170a and the radius of curvature CR2 of the back frame 140 may be, for example, greater than 0 mm and less than 8000 mm (0 mm<difference<8000 mm), but is not limited thereto. In some embodiments, the difference between the radius of curvature CR4 of the protective substrate 170a and the radius of curvature CR2 of the back frame 140 may be, for example, greater than 0 mm and less than 6000 mm (0<difference<6000 mm). In some embodiments, the difference between the radius of curvature CR4 of the protective substrate 170a and the radius of curvature CR2 of the back frame 140 may be, for example, greater than 0 mm and less than 5000 mm (0<difference<5000 mm). So far, the second pre-bending step has been substantially completed. In some embodiments, the radius of curvature CR4 of the protective substrate 170a may be, for example, less than 4500 mm (CR4<4500 mm) or less than 3500 mm (CR4<3500 mm), but is not limited thereto. In some embodiments, the radius of curvature CR2 of the back frame 140 may be, for example, less than 3500 mm (CR2<3500 mm) or less than 2500 mm (CR2<2500 mm), but is not limited thereto.

Next, before the protective substrate 170a with the radius of curvature CR4 is assembled to the back frame 140, steps such as a decoration process, a surface treatment process and/or a lamination process are performed on the protective substrate 170a with the curvature radius CR4 to obtain a substrate structure S, but is not limited thereto.

In some embodiments, the decoration process may be to form a decoration layer 180 on the third surface 173 of the protective substrate 170a. The decoration layer 180 includes, for example, a light-absorbing material or a filter material, such as an ink (black ink), a filter layer (color filter layer) or other suitable materials, but is not limited thereto. In some embodiments, the decoration layer 180 is disposed on at least one side or a periphery of the third surface 173 of the protective substrate 170a, for example. In some embodiments, the decoration layer 180 has an opening O1, for example. In some embodiments, the decoration layer 180 includes, for example, a black matrix layer (BM). The decoration layer 180 may cover a part of the third surface 173 and expose another part of the third surface 173, but is not limited thereto.

In some embodiments, the surface treatment process may be to form a functional layer 182 on the fourth surface 174 of the protective substrate 170a, but is not limited thereto. The functional layer 182 may include anti-reflective coating (AR), anti-smudge coating (AS), anti-fingerprint coating (AF), anti-scratch coating, other suitable functional coatings, or a combination of the foregoing, but is not limited thereto.

In some embodiments, the substrate structure S may further include a display panel 184, but is not limited thereto.

In some embodiments, the lamination process may be to bond the display panel 184 on the third surface 173 of the protective substrate 170a. The display panel 184 may for example, substantially overlap the opening O1 of the decoration layer 180, but is not limited thereto. In some embodiments, a part of the display panel 184 may for example, overlap the decoration layer 180, but is not limited thereto. In some embodiments, the display panel 184 may or may not be in contact with the decoration layer 180. In some embodiments, in a direction of the top view, an area of the display panel 184 may be the same as or different from an area of the opening O1 of the decoration layer 180. In some embodiments, in the direction of the top view, an area of the display panel 184 may be the same as an area of the opening O1 of the decoration layer 180. In some embodiments, in the direction of the top view, an area of the display panel 184 may be smaller than an area of the opening O1 of the decoration layer 180. In some embodiments, in the direction of the top view, an area of the display panel 184 may be larger than an area of the opening O1 of the decoration layer 180. In some embodiments, in the direction of the top view, an outline of the display panel 184 may be the same as or different from an outline of the opening O1 of the decoration layer 180. In some embodiments, the display panel 184 may include a non-self-luminous panel (such as a liquid crystal panel) or a self-luminous panel (such as a light-emitting diode panel), but is not limited thereto. In some embodiments, when the circuit board 110 may be used as a display panel, the display panel 184 may be omitted, the protective substrate 170a may be arranged above the circuit board 110, and the decoration layer 180 and/or the functional layer 182 may be formed on the protective substrate 170a.

Then, please refer to FIG. 9B, the back frame 140 with the radius of curvature CR2 is provided, and the protective substrate 170a (or substrate structure S) with the radius of curvature CR4 is assembled to the back frame 140. Specifically, in the electronic device 100e of FIG. 9B, an adhesive 150e is firstly disposed on a top surface 1413 of a sidewall 1422 of a curved frame 141 of the back frame 140. Next, a pressing mechanism 160e having a adsorption function and approximately having a radius of curvature CR3 is provided, and for example, a vacuum adsorption nozzle 165 on the pressing mechanism 160e is used to adsorb the substrate structure S (including the protective substrate 170a), so that the substrate structure S (including the protective substrate 170a) is, for example, pre-bent to form a substrate structure S1 (including the protective substrate 170a) with a radius of curvature CR3. Next, the substrate structure S1 (including the protective substrate 170a) with the radius of curvature CR3 is pressed by the pressing mechanism 160e, so that the substrate structure S1 (including the protective substrate 170a) with the radius of curvature CR3 is closely attached and assembled to the back frame 140 through the adhesive 150e, and the electronic device 100e of this embodiment is completed. In some embodiments, a difference between the radius of curvature CR3 of the pressing mechanism 160e and the radius of curvature CR2 of the back frame 140 may be, for example, within 10%, but is not limited thereto. In some embodiments, the radius of curvature CR4 may for example, be greater than the radius of curvature CR3, but is not limited thereto. In some embodiments, the radius of curvature CR4 may for example, be greater than the radius of curvature CR2, but is not limited thereto.

In some embodiments, the substrate structure S (including the protective substrate 170a) having the radius of curvature CR4 may be firstly bent to the substrate structure S1 (or the protective substrate 170a) having the radius of curvature CR3 by means of external forces such as the adsorption of the pressing mechanism 160e and the attachment and fixation of the adhesive 150e. Therefore, when the substrate structure S1 on the electronic device 100e is no longer fixed by the adhesive 150e and is separated from the back frame 140, the bending state of the substrate structure S1 having the radius of curvature CR3 will approximately restore, for example, to the substrate structure S having the radius of curvature CR4.

Generally, the method of directly fixing the non-curved (or planar) protective substrate on the curved back frame 140 by cold bending has the following disadvantages: an adhesive with strong adhesive force is required to fix the protective substrate (or substrate structure S) and the curved back frame 140, and there are many restrictions on the appearance design of the back frame 140, the protective substrate 170a or the substrate structure S. However, in this embodiment, the non-curved (or planar) protective substrate is first bent to a protective substrate having the radius of curvature larger than the radius of curvature of the back frame through the second pre-bending step, so that the protective substrate (or the substrate structure S) may be assembled to the curved back frame by using the adhesive with less adhesive force, and this method has less restrictions on the appearance design of the back frame 140, the protective substrate 170a or the substrate structure S.

Generally, the method of bending the protective substrate to have the same radius of curvature as the back frame by hot bending has the following disadvantages: a higher process temperature is required, or a longer heating and cooling time is required, and the curved surface of the protection substrate (or the substrate structure S) formed by the hot bending is not easy to carry out the subsequent decoration process or surface treatment process. However, in this embodiment, the non-curved (or planar) protective substrate is first bent to a protective substrate having the radius of curvature larger than the radius of curvature of the back frame through the second pre-bending step, so that a lower process temperature may be used, a shorter heating and cooling time may be used, and the subsequent decoration process or surface treatment process may be carried out easily. The method of the hot bending refers to: before assembling the protective substrate to the back frame, for example, using a higher process temperature (about 800° C. to 900° C.) to bend the non-curved (or planar) protective substrate into the protective substrate having the same radius of curvature as the back frame.

Figure 10:
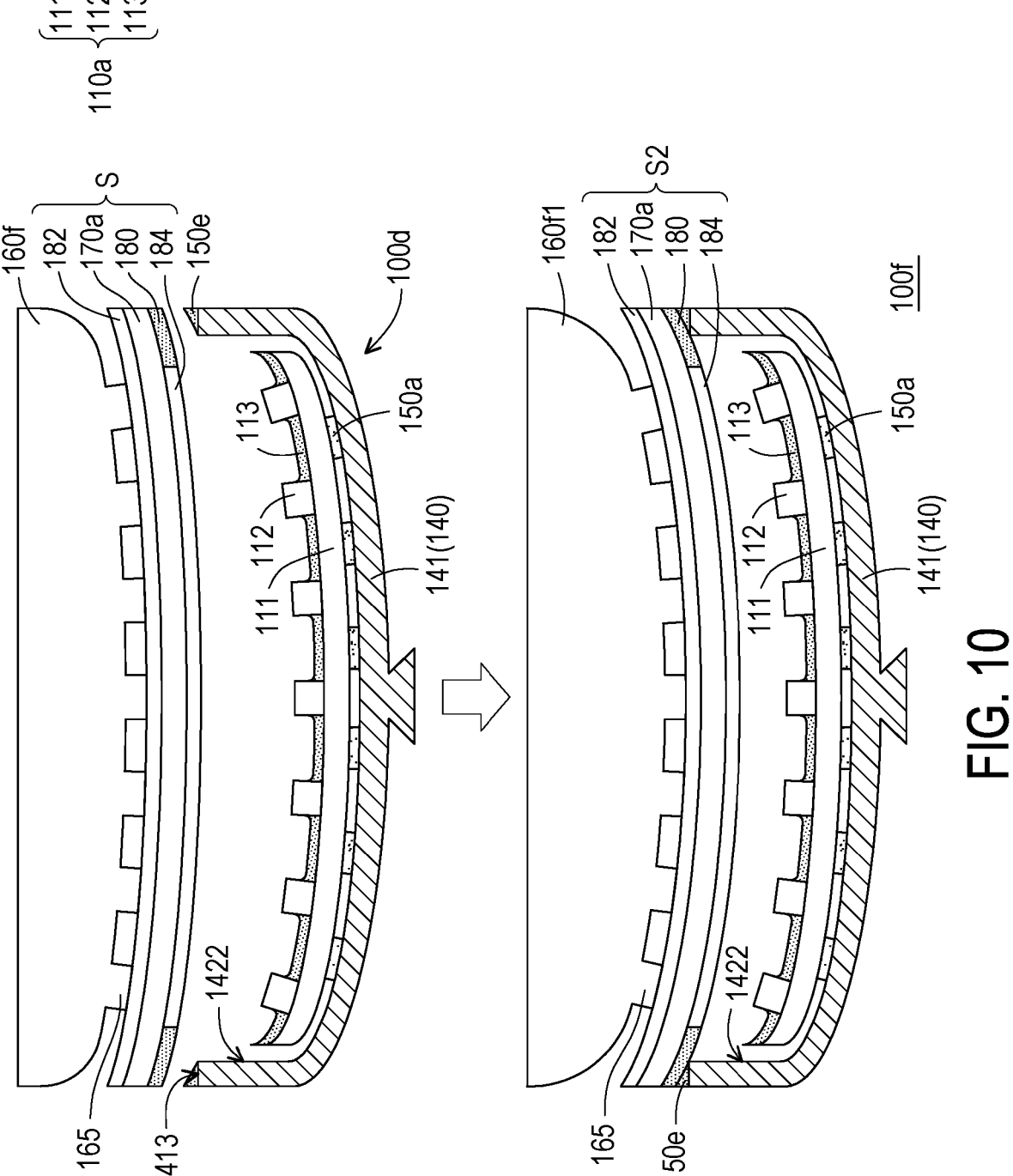
FIG. 10 is a schematic cross-sectional view of a method for manufacturing an electronic device according to another embodiment of the disclosure.

FIG. 10 is a schematic cross-sectional view of a method for manufacturing an electronic device according to another embodiment of the disclosure. FIG. 10 is a step continuing FIG. 9A and replacing FIG. 9B. The same or similar components in the embodiment of FIG. 10 and the embodiment of FIGS. 9A to 9B may be applied using the same materials or methods, so the same and similar descriptions in the two embodiments will not be repeated herein, and the main difference between the two embodiments will be described.

Please refer to FIG. 10, firstly, in the electronic device 100d of FIG. 8, the adhesive 150e is disposed on the top surface 1413 of the sidewall 1422 of the curved frame 141 of the back frame 140. Next, a pressing mechanism 160f having an adsorption function and a radius of curvature CR4 is provided, and a vacuum adsorption nozzle 165 on the pressing mechanism 160f is used to absorb the substrate structure S (including the protective substrate 170a). The pressing mechanism 160f includes a deformable structure, such as an air bag or other suitable structures, but is not limited thereto.

Next, the pressing mechanism 160f is deformable and the back frame 140 has a radius of curvature CR2, so that when the pressing mechanism 160f is used to press the substrate structure S having the radius of curvature CR4, the pressing mechanism 160f having the radius of curvature CR4 may be transformed into a pressing mechanism 160f1 substantially having a radius of curvature CR2 due to deformation, the substrate structure S (including the protective substrate 170a) having the radius of curvature CR4 may be closely attached by the adhesive 150e and then bent to the substrate structure S2 (containing the protective substrate 170a) having the radius of curvature CR2, and the substrate structure S2 (including the protective substrate 170a) may be assembled to the back frame 140. So far, the electronic device 100f of this embodiment has been substantially completed.

In this embodiment, the substrate structure S (including the protective substrate 170a) having the radius of curvature CR4 may be bent to the substrate structure S2 (including the protective substrate 170a) having the radius of curvature CR2 through the pressing of the deformable pressing mechanism 160f and the attachment and fixation of the adhesive 150e. Therefore, when the substrate structure S2 on the electronic device 100f is no longer fixed by the adhesive 150e and is separated from the back frame 140, the bending state of the substrate structure S2 having the radius of curvature CR2 will change and approximately restore to the substrate structure S having the radius of curvature CR4.

To sum up, in the electronic device and the manufacturing method thereof according to one or more embodiments of the disclosure, the non-curved or planar circuit board is firstly bent to have the radius of curvature similar to that of the back frame through the first pre-bending step, so that when the circuit board with the curved surface is pressed down and attached to the curved back frame, a chance of cracking the circuit board may be reduced or a yield of the electronic device may be improved. By the design of the patterned adhesive between the circuit board and the back frame, so that air bubbles between the adhesive and the curved frame (or between the adhesive and the circuit board) may be eliminated when the circuit board is pressed to the back frame, thereby improving the adhesion effect or flatness of the adhesive. In addition, compared with the general method of bending the protective substrate by cold bending, this embodiment using a method of firstly bending the non-curved (or planar) protective substrate to a protective substrate having the radius of curvature larger than that of the back frame through the second pre-bending step, so that the protective substrate may be assembled to the curved back frame using the adhesive with less adhesive force, and restrictions on the appearance design of the back frame or the protective substrate may be reduced. In addition, compared with the general method of bending the protective substrate to have the same radius of curvature as the back frame by hot bending, this embodiment using a method of firstly bending the non-curved (or planar) protective substrate to a protective substrate having the radius of curvature larger than that of the back frame through the second pre-bending step, so that a lower process temperature may be used, a shorter heating and cooling time may be used, and the subsequent decoration process or surface treatment process may be carried out easily. In other words, a decoration layer or a functional layer, for example, may be formed more uniformly.

Finally, it should be noted that the above embodiments serve to illustrate rather than limiting the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

What is claimed is:

1. A method of manufacturing an electronic device, comprising:

providing a circuit board;

performing a first pre-bending step on the circuit board so that the circuit board is bent to have a first radius of curvature;

providing a back frame having a second radius of curvature; and attaching the circuit board having the first radius of curvature to the back frame through an adhesive, wherein a difference between the first radius of curvature and the second radius of curvature is within 10%.

2. The method of manufacturing the electronic device according to claim 1, wherein the adhesive is a patterned adhesive.

3. The method of manufacturing the electronic device according to claim 1, wherein the first pre-bending step comprises:

configuring the circuit board to a carrier having a curved surface; and absorbing the circuit board by an adsorption mechanism, so that the circuit board is bent to have the first radius of curvature.

4. The method of manufacturing the electronic device according to claim 1, wherein when the circuit board having the first radius of curvature is attached to the back frame through the adhesive, pressing the circuit board with a pressing mechanism having a third radius of curvature, wherein a difference between the third radius of curvature and the second radius of curvature is within 10%.

5. The method of manufacturing the electronic device according to claim 4, wherein the pressing mechanism has a plurality of pressing bars, and the plurality of pressing bars do not overlap a plurality of electronic components of the circuit board in a normal direction of the circuit board.

6. The method of manufacturing the electronic device according to claim 5, wherein a width of the plurality of pressing bars is smaller than a width of a gap between two adjacent electronic components of the plurality of electronic components.

7. The method of manufacturing the electronic device according to claim 1, wherein the first radius of curvature and the second radius of curvature are smaller than 5000 mm.

8. An electronic device, comprising:

a back frame having a first curved surface;

a circuit board disposed on the back frame and having a second curved surface; and a patterned adhesive disposed between the back frame and the circuit board, wherein the patterned adhesive has an adhesive area attached to the circuit board, a surface of the circuit board adjacent to the patterned adhesive has a surface area, and the adhesive area and the surface area meet the following relationship: 30%≤adhesive area/surface area≤99%.

9. The electronic device according to claim 8, wherein the patterned adhesive has a concave-convex surface.

10. The electronic device according to claim 9, wherein the concave-convex surface comprises a concave surface and a convex surface, and a ratio of a thickness of the concave surface to a thickness of the convex surface is between 0.1 and 0.9.

11. The electronic device according to claim 9, wherein the concave-convex surface is adjacent to the circuit board.

12. The electronic device according to claim 9, wherein the concave-convex surface is far away from the circuit board.

13. The electronic device according to claim 8, wherein the patterned adhesive comprises a plurality of sub-parts separated from each other, and the plurality of sub-parts overlap the circuit board.

14. The electronic device according to claim 13, wherein the patterned adhesive further comprises a gap disposed between two adjacent sub-parts of the plurality of sub-parts.

15. The electronic device according to claim 8, wherein the adhesive area and the surface area meet the following relationship: 30%≤adhesive area/surface area≤80%.

16. The electronic device according to claim 8, wherein the back frame comprises a accommodating groove, there is a gap between a side wall of the accommodating groove and an edge of the circuit board, and a width of the gap is 0.1 mm to 20 mm.

17. The electronic device according to claim 8, wherein an edge of the circuit board is not aligned with an edge of the patterned adhesive.

18. A method of manufacturing an electronic device, comprising:

providing a protective substrate;

performing a second pre-bending step on the protective substrate so that the protective substrate is bent to have a fourth radius of curvature;

providing a back frame having a second radius of curvature; and assembling the protective substrate having the fourth radius of curvature to the back frame, wherein the second radius of curvature is smaller than the fourth radius of curvature, and a difference between the fourth radius of curvature and the second radius of curvature is greater than 0 mm and less than 8000 mm.

19. The method of manufacturing the electronic device according to claim 18, wherein a process temperature of the second pre-bending step is between 600° C. and 900° C.

20. The method of manufacturing the electronic device according to claim 18, wherein the difference is greater than 0 mm and less than 6000 mm.

* * * * *